(12) United States Patent
Nakagawa et al.

(10) Patent No.: US 7,477,354 B2
(45) Date of Patent: Jan. 13, 2009

(54) PROJECTION EXPOSURE APPARATUS AND METHOD FOR PRODUCING A PRINTED CIRCUIT BOARD

(75) Inventors: Wataru Nakagawa, Tokyo (JP); Kazunori Hashimoto, Tokyo (JP)

(73) Assignee: Adtec Engineering Co., Ltd., Tokyo (JP)

(*) Notice: Subject to any disclaimer, the term of this patent is extended or adjusted under 35 U.S.C. 154(b) by 70 days.

(21) Appl. No.: 11/185,264

(22) Filed: Jul. 20, 2005

(65) Prior Publication Data

US 2006/0050254 A1  Mar. 9, 2006

(30) Foreign Application Priority Data

Sep. 3, 2004 (JP) ............... 2004-256940

(51) Int. Cl.
*G03B 27/42* (2006.01)
*G03B 27/54* (2006.01)

(52) U.S. Cl. .......................... 355/53; 355/67
(58) Field of Classification Search ............. 355/53, 355/67–71, 77, 52, 55; 356/399–401; 250/548
See application file for complete search history.

(56) References Cited

U.S. PATENT DOCUMENTS

| | | | | |
|---|---|---|---|---|
| 4,878,086 A * | 10/1989 | Isohata et al. | ............ | 355/77 |
| 5,528,118 A * | 6/1996 | Lee | ............ | 318/568.17 |
| 6,288,772 B1 * | 9/2001 | Shinozaki et al. | ............ | 355/53 |
| 6,713,231 B1 * | 3/2004 | Hasegawa et al. | ............ | 430/311 |
| 7,030,962 B2 * | 4/2006 | Iizuka et al. | ............ | 355/53 |
| 2002/0180947 A1 * | 12/2002 | Pierrat | ............ | 355/77 |
| 2004/0268272 A1 * | 12/2004 | Farrow et al. | ............ | 716/1 |
| 2005/0170296 A1 * | 8/2005 | Jansen et al. | ............ | 430/396 |
| 2005/0286042 A1 * | 12/2005 | Schoormans et al. | ............ | 355/77 |

* cited by examiner

*Primary Examiner*—Hung Henry Nguyen
(74) *Attorney, Agent, or Firm*—Nields & Lemack

(57) ABSTRACT

A projection exposure apparatus and a method for producing a printed circuit board wherein, the whole pattern including pieces 10 and coupons 12 to be exposed on a print circuit board 2 is depicted on a photo mask 1 divided in six areas by divide line 19, the exposure will be made with respect to the each divided area of the photo mask 1 mounted on a movable photo mask stage 5 with using a masking device 3 masking other area than the exposing area.

9 Claims, 4 Drawing Sheets

PROJECTION EXPOSURE APPARATUS AND METHOD FOR PRODUCING A PRINTED CIRCUIT BOARD

BACKGROUND OF THE INVENTION

Field of the Invention and Related Art Statement

The present invention relates to a projection exposure apparatus and a method for producing a printed circuit board.

The photolithography method is applied widely in various fields, wherein a pattern is photographically imprinted by an exposure device on the surface of a board coated with photosensitive materials such as the photo resist, thereafter the pattern is formed on the board by etching process. Printed circuit boards are also fabricated by using the exposure device in recent years as shown in Japan Patent Laid-open No. 2000-250227 and Japan Patent Laid-open No. 2000-292942.

Printed circuit boards become smaller as machines become miniaturized in recent years and for more efficient manufacturing process, a large-sized board is used. Such large-sized board is exposed with a plurality of the circuit and will be cut into small-sized boards in the following process.

With such a large-sized board, it is impossible to expose the circuits at one time because the size of the board is larger than the irradiation area of an exposing light source. To solve this problem, a successively exposing method (stepper) is proposed, wherein a circuit depicted on a photo mask is repeatedly exposed by successively moving a stage on which the print circuit board is placed.

However, the stepper method can expose only the plurality of the same pattern on the board because it merely exposes one pattern depicted on a photo mask on a board repeatedly.

Further various indications called "coupons" describing information are often needed to be exposed on the periphery of the board in addition to the circuit patterns in practical cases and it is impossible so far to expose such coupons by prior stepping exposure.

The prior stepping exposure also cannot expose different patterns on the same board. To realize this, it is necessary to prepare a plurality of photo masks and to change the photo masks at every exposure, which is not practical way.

The object of the invention is to provide the projection exposure device and the method that can expose coupons on the periphery of the board and expose different patterns on the board without exchanging the photo masks.

SUMMARY OF THE INVENTION

The projection exposure apparatus of the invention comprises a light source for irradiating exposing light, a photo mask and optics positioned between the photo mask and a print circuit board.

The photo mask is bigger than an irradiating area of said light source, depicted with a whole pattern to be exposed on the print circuit board. The pattern has a plurality of circuits to be exposed and the circuits may be the same or may be different. The pattern typically has a coupon which describes necessary information.

In the invention, the photo mask is movable by a photo mask moving device for positioning a certain area to the irradiating area of the light from said light source. In the prior art, the photo mask needs not be movable, because whole pattern on the mask can be exposed by one exposure, however the photo mask and the whole pattern thereon of the invention are larger than the irradiation area and separately exposed at several times by moving against the irradiation area of the exposing light. In the preferable embodiment, the photo mask moving device is adapted to lift the photo mask by air and move it by a step.

A mask changer for supplying a photo mask to the photo mask moving device and removing the photo mask from said photo mask moving device may be provided.

The print circuit board is also movable by a moving device for positioning a certain area of said print circuit board to an exposing area where said exposing light through said photo mask and optics irradiates. There is optics positioned between said photo mask and said board for exposing the pattern on the photo mask with expansion or reduction at predetermined magnification.

Said pattern of said certain area of the photo mask is exposed by the light from said light source through the optics on said certain area of the printed circuit board. Whole pattern on the mask will be exposed all over the print circuit board by repeating said positioning of the mask and the board and exposing.

A masking device may be used for masking other area than the certain area of the photo mask in order to define the exposing area. Such masking device also makes it possible to change the size of the exposing area at every exposure.

A photo mask is depicted typically with circuit patterns and a coupon that describes information about the board. The patterns may be relational or may be independent each other. The independent patterns preferably include information describing the positions thereof in the photo mask. Blank spaces with a certain width are preferably provided between the independent patterns.

In the above configuration, the photo mask has the whole pattern to be exposed on the board and the partial area of the photo mask is exposed on the partial area of the print circuit board. Therefore a various exposures can be conducted, for examples, different patterns may be exposed on the same print circuit board with one photo mask and a different size of exposure can be made by using the masking device. Further various additional exposures such as coupons can be made at the periphery of the board.

DETAILED DESCRIPTION OF PREFERRED EMBODIMENTS

Figure 1:
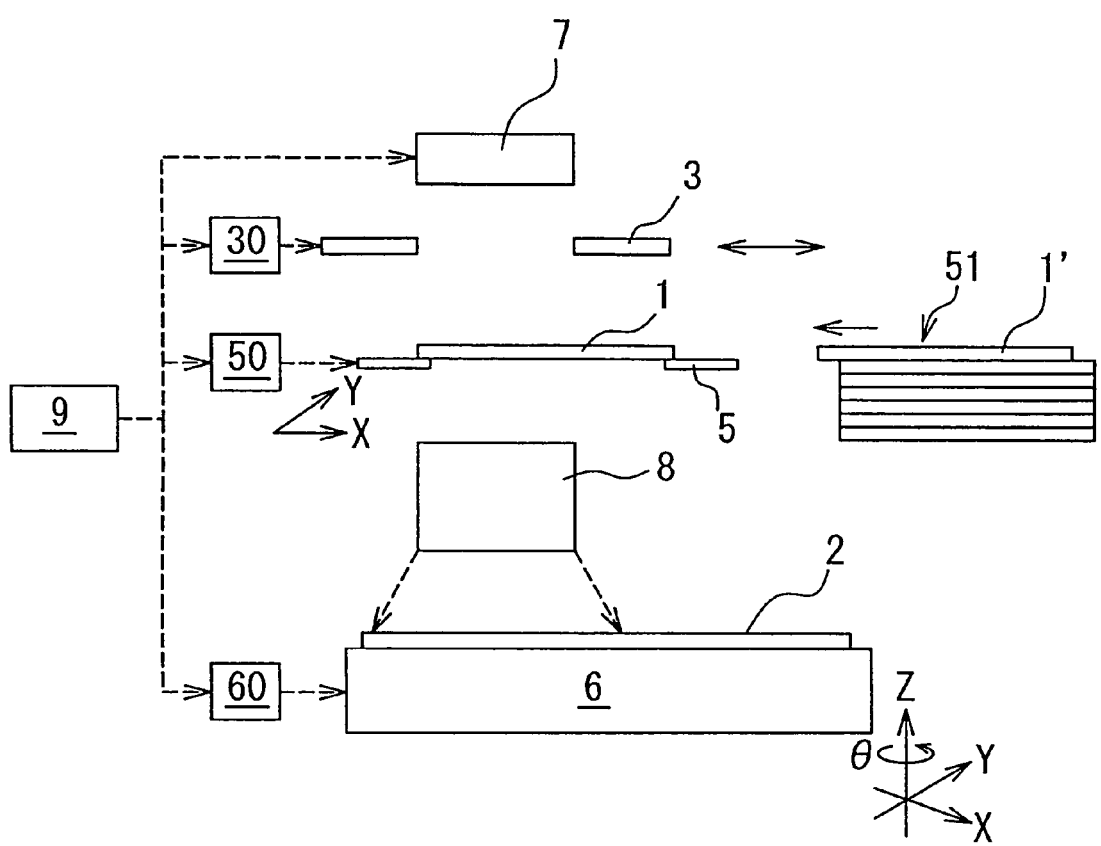
FIG. 1 shows a schematic view of an embodiment of the invention.

An embodiment of the invention will now be described in reference to the attached drawings. FIG. 1 shows a projection exposure device for producing a printed circuit board. A print circuit board 2 provided with photo resist is placed on a board stage 6 that is movable in the XYZ and θ directions by a board moving device 60.

A photo mask 1 on which circuit patterns are depicted is mounted on a photo mask stage 5 and faces to the print circuit board 2 in order to expose circuit patterns on the print circuit board 2 by an exposing light such as ultraviolet rays from a light source 7. The photo mask stage 5 is movable in XY direction by a photo mask moving device 50. The photo mask stage 5 is adapted to float by air pressure and be moved in a step by the photo mask moving device 50. The photo mask 1 is supplied and removed for changing to and from the photo mask stage 5 by a photo mask changer 51 that has a plurality of the photo mask 1' in stock.

A masking device 3 is provided between the light source 7 and the photo mask 1. The masking device 3 masks a certain part of the photo mask 1 in order not to expose the unintended part. The masking device 3 is driven by a mask driving device 30.

An alignment device (not shown) having a CCD camera is further provided, wherein the exposing area of the photo mask 1 is aligned with the area to be exposed on the print circuit board 2 with driving the board stage 6 in XY directions by the board moving device 60 using a board alignment mark provided on the print circuit board 2 and an alignment mark 15 on the photo mask 1.

Said mask driving device 30, photo mask moving device 50, board moving device 60, light source 7 and the alignment device are controlled by a controller 9.

Figure 2:
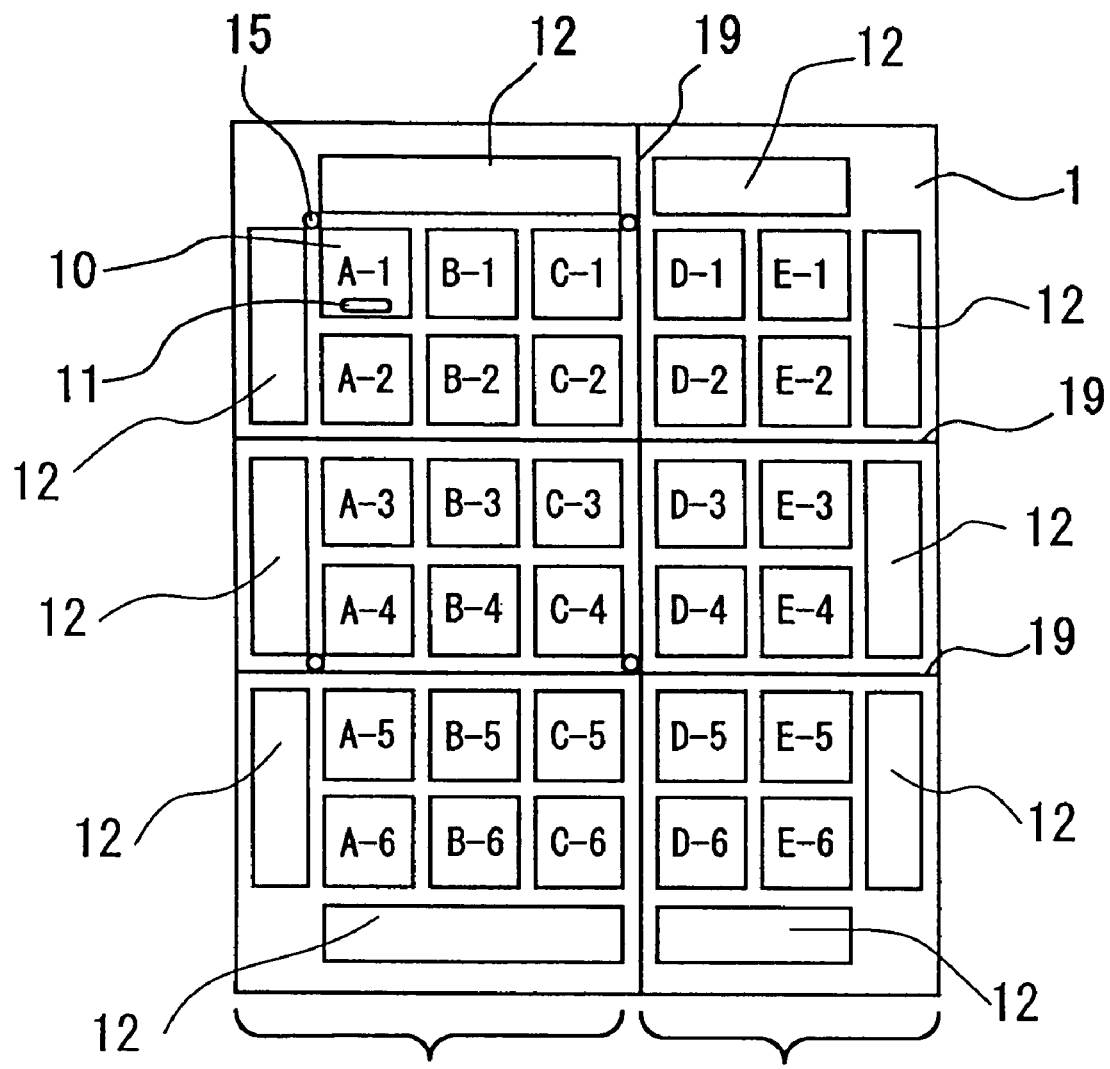
FIG. 2 shows an explanatory view of the photo mask 1 of the embodiment.

As shown in FIG. 2, all the patterns and the whole pattern to be exposed on the print circuit board 2 are drawn on the photo mask 1. Namely the patterns depicted on the photo mask 1 are the same as the patterns to be exposed on the print circuit board 2 and they provide one to one correspondence. In this embodiment, the pattern contains a plurality of pieces 10, which are independent circuit patterns, and coupons 12 describing various information to be exposed on the periphery of the print circuit board 2.

In this embodiment, from A-1 to E-6 of the pieces 10 and from 1 to 10 of the coupons 12 are depicted. Each of the pieces 10 may be the same pattern or may be different patterns.

Each of the pieces 10 has position information 11 indicating the position of the piece 10 on the photo mask 1. In the embodiment, the position numbers such as A-1 or B-1 are written. Blank spaces are provided between the pieces 10 with a certain gap. Divide lines 19 are provided in the space to define the exposing area. In the embodiment, the exposure areas are divided into 6 areas and the exposure will be made six times.

As shown in FIG. 2, a left side area and a right side area of the divided exposing areas are not the same but unequal in size.

The invention makes it possible to expose the unequally divided area like this and that is one of the characteristics of the invention.

Figure 4:
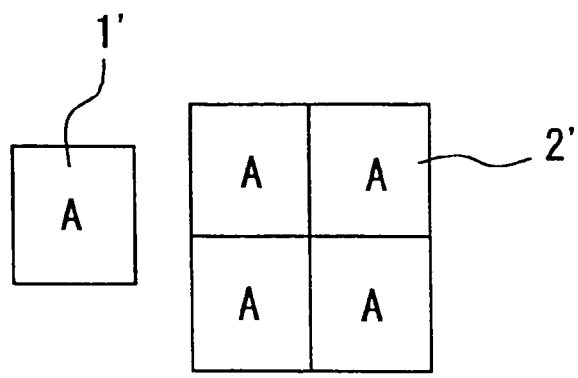
FIG. 4 shows an explanatory view of the invention comparing with the prior art.
Figure 4:
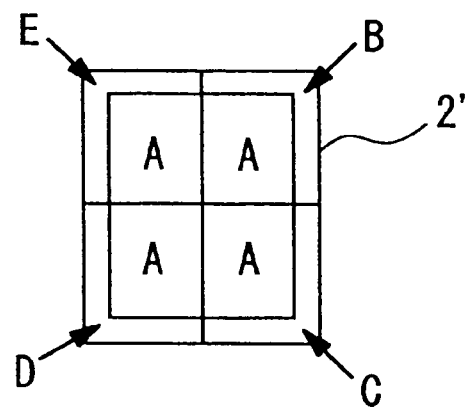
Figure 4:
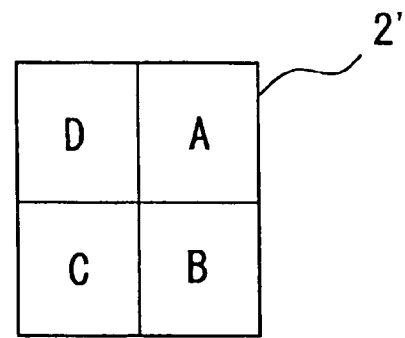

The problem of the stepper method of the prior art will be explained again referring to FIG. 4. In the prior art as shown in (A), the photo mask 1' has only a single pattern being able to be exposed at once, and the single pattern is exposed repeatedly all over the print circuit board 2'. Thus the plurality of the same pattern is to be exposed on print circuit board 2' and any other pattern cannot be exposed.

However the indications B, C, D and E such as coupons as shown in (B) often need to be exposed around the circuit patterns and such additional exposure cannot be made by the prior stepper method.

Further sometimes it is required to make different patterns A, B, C and D on the print circuit board 2 as shown in (C), but the prior art of the stepper method cannot meet such a requirement.

Figure 3:
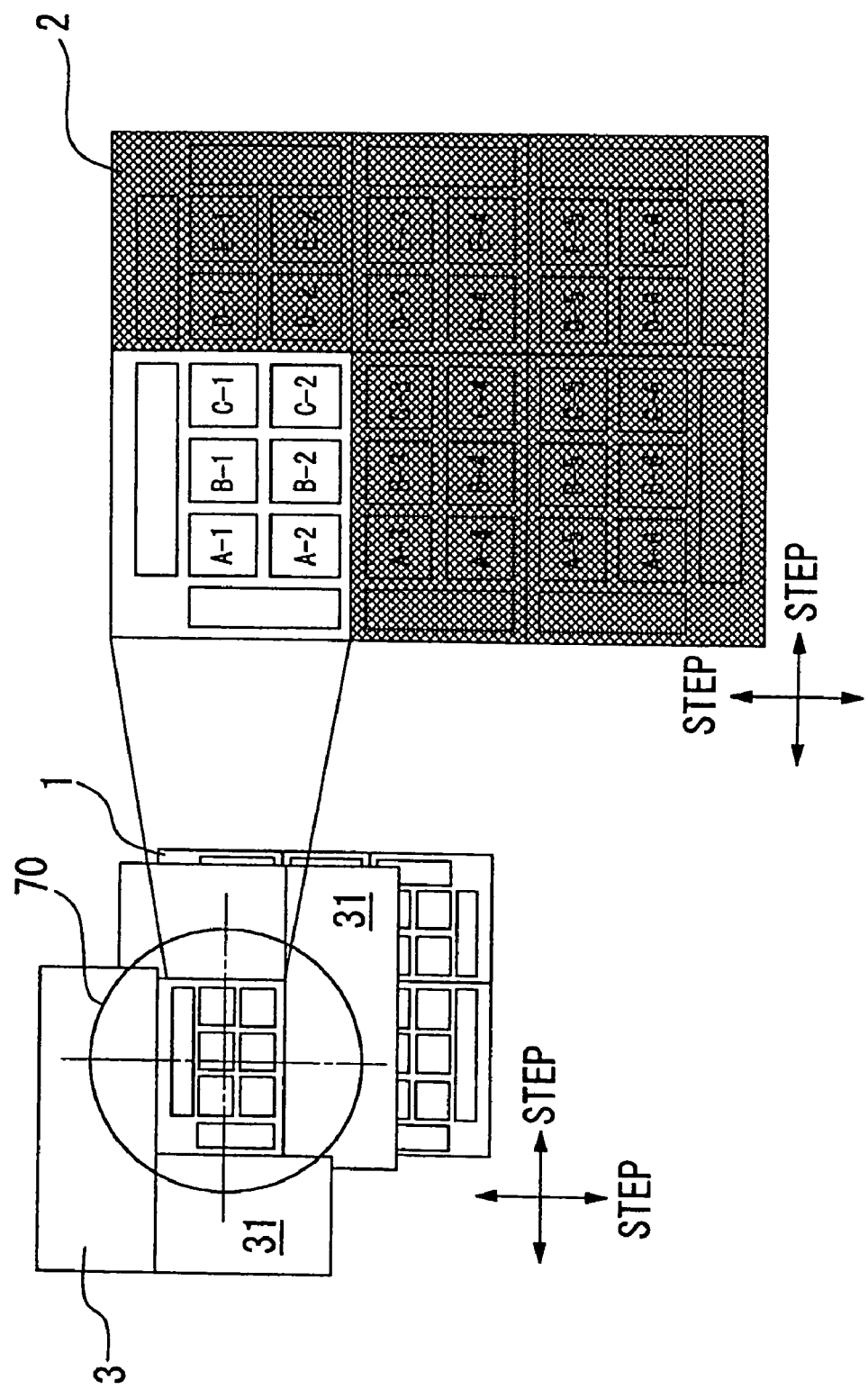
FIG. 3 shows an operation of the embodiment.

As shown in FIG. 2 and FIG. 3, all the patterns to be exposed on the print circuit board 2 are depicted on the photo mask 1 in the invention.

When a large-sized print circuit board 2 is used and the photo mask 1 is proportionally large, an irradiation area 70 of the light source 7 becomes smaller than the photo mask 1 as shown in FIG. 3 and the whole photo mask 1 cannot be exposed at once. Then the exposing area of the photo mask 1 is divided into the plural small area and the exposure is made at every small area repeatedly with moving successively the photo mask 1 and the print circuit board 2.

The embodiment of FIG. 3 shows that the photo mask 1 is divided into six areas by the divide line 19 shown in FIG. 2 and six times exposures will be conducted to complete a whole exposure covering all the patterns depicted on the photo mask 1.

The masking device 3 includes a pair of masking blade 31, 31 shaped in "L" that masks the part except the exposing area to expose only the intentional area. The masking blade 31, 31 are driven by the mask driving device 30 in order to define the size of the exposing area. By using the masking device 3, the intended size and position of the area can be obtained and the size can be different at each exposure.

The size of the photo mask 1 of the embodiment is half of the print circuit board 2 and the pattern drawn on the photo mask 1 is magnified twice by a projection lens 8 to be exposed.

When exposing one by one the area of the patterns grouped by the divide line 19, at first the photo mask 1 is aligned with the print circuit board 2 with respect to the area to be exposed. The board stage 6 on which the print circuit board 2 is placed is movable in XYZ and θ directions, and is moved in XY direction by the board moving device 60 to position the exposing area to a center of a optical axis of the projection lens 8.

The photo mask stage 5 also moves the exposing area of the photo mask 1 to the irradiation area 70 by the photo mask moving device 50 and the alignment is made with an alignment device (not shown) by using the alignment mark 15 and a board mark (not shown).

Then the exposure is carried out after the masking device 3 masks the periphery of the exposing area.

The above operation will be made successively at every area to complete the exposure over the whole print circuit board 2.

As described above, the invention makes it possible to expose the patterns at the periphery of the printed circuit board such as coupon 12, which cannot be exposed by the prior stepper method. Furthermore the exposure of the unequally divided area may also be realized, wherein the exposing area is divided in different sizes with the divide line 19 as shown in FIG. 2.

Though the pieces 10 are the same pattern in the embodiment, pieces 10 may be different patterns.

What is claimed is:

1. A projection exposure apparatus comprising:
   a light source for irradiating exposing light,
   a photo mask bigger than a irradiating area of said light source and smaller than a print circuit board as an exposing target, depicted with a whole pattern to be exposed on said print circuit board, wherein said whole pattern comprises independent patterns, and information about positions on said photo mask of said each independent pattern are described on said photo mask,
   optics positioned between said photo mask and said board for exposing said pattern of the photo mask on said board with expansion at predetermined magnification,
   a photo mask moving device for positioning a certain area of said photo mask to said irradiating area of said irradiation light from said light source,
   a board moving device for positioning a certain area of said printed circuit board to an exposing area where said exposing light irradiates through said photo mask and said optics, wherein a first pattern disposed in said certain area of the photo mask is exposed by the light from said light source on said certain area of the printed circuit board, then, in the same manner, other patterns disposed on said photo mask in areas other than said certain area of said photo mask are successively exposed by the light from said light source on areas of the printed circuit board other than said certain area of said printed circuit board in order to expose said whole pattern on the entire printed circuit board and to expose the same patterns as depicted on said photo mask on said printed circuit board.

2. The projection exposure apparatus of the claim 1 further comprising:

a masking device for masking an area other than a certain area of said photo mask in order to determine said exposing area.

3. The projection exposure apparatus of the claim 1 wherein, said whole pattern to be exposed on said printed circuit board includes a test coupon.

4. The projection exposure apparatus of the claim 1 wherein, blank spaces with a certain width are provided between said independent patterns.

5. The projection exposure apparatus of the claim 1 further comprising:

a mask changer for supplying a photo mask to said photo mask moving device and removing the photo mask from said photo mask moving device.

6. A projection exposure method comprising the steps of:

preparing a printed circuit board as an exposing target and a photo mask bigger than an irradiating area of a light source for irradiating exposing light and smaller than a printed circuit board as an exposing target, depicted with a whole pattern to be exposed on said board, wherein said whole pattern comprises independent patterns, and information about positions on said photo mask of said each independent pattern are described on said photo mask, positioning a certain area of said photo mask by moving said photo mask to said irradiating area of said irradiation light from said light source, positioning a certain area of said printed circuit board by moving said board to an exposing area where said exposing light irradiates through said photo mask, exposing said pattern of the photo mask on said board with expansion at predetermined magnification through optics after said positioning, then, in the same manner, successively exposing portions other than said certain area of said photo mask on the areas of said printed circuit board other than said certain area of said printed circuit board in order to expose said whole pattern on the entire printed circuit board and to expose the same patterns as depicted on said photo mask on said printed circuit board.

7. A projection exposure method of the claim 6 wherein, said exposing step includes a plurality of exposures by masking a part other than said certain area of said photo mask and said whole pattern is all exposed on said board by said plurality of exposures.

8. A projection exposure method of the claim 7 wherein, at least one of said exposure steps has a different size of said certain area than other exposing steps.

9. The projection exposure method of the claim 7 wherein, blank spaces with a certain width are provided between said independent patterns.

* * * * *